(12) United States Patent
Beaman et al.

(10) Patent No.: US 10,903,593 B2
(45) Date of Patent: Jan. 26, 2021

(54) OFF THE MODULE CABLE ASSEMBLY

(71) Applicant: INTERNATIONAL BUSINESS MACHINES CORPORATION, Armonk, NY (US)

(72) Inventors: Brian Beaman, Cary, NC (US); Jason R. Eagle, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/411,309

(22) Filed: May 14, 2019

(65) Prior Publication Data
US 2020/0366015 A1 Nov. 19, 2020

(51) Int. Cl.
*H01R 12/57* (2011.01)
*H01R 12/71* (2011.01)
(Continued)

(52) U.S. Cl.
CPC .......... *H01R 12/716* (2013.01); *H01R 12/57* (2013.01); *H01R 12/7005* (2013.01); *H01R 12/7082* (2013.01); *H01R 12/771* (2013.01); *H01R 13/17* (2013.01); *H01R 13/6658* (2013.01); *H01R 43/20* (2013.01); *H01R 2107/00* (2013.01); *H05K 2201/10189* (2013.01)

(58) Field of Classification Search
CPC ...... H01R 12/716; H01R 12/57; H01R 43/20; H01R 12/7082; H01R 13/17; H01R 12/7005; H01R 13/6658; H01R 12/771; H01R 2107/00; H05K 2201/10189
See application file for complete search history.

(56) References Cited

U.S. PATENT DOCUMENTS 4,756,694 A * 7/1988 Billman ............... H01R 12/721
439/61
5,092,782 A 3/1992 Beaman
(Continued)

FOREIGN PATENT DOCUMENTS

WO 2018170209 A 9/2018

OTHER PUBLICATIONS

Deutsch et al., "Characterization and Performance Evaluation of Differential Shielded Cables for Multi-Gb/s Data-Rates", IEEE Mar. 2002, pp. 1-17.

*Primary Examiner* — Truc T Nguyen
(74) *Attorney, Agent, or Firm* — Tihon Poltavets

(57) ABSTRACT

An Off The Module (OTM) cable assembly includes a back shell assembly and a guide block, where the guide block is disposed on a top surface of a electronic package. The back shell assembly is disposed inside a cavity of the guide block, where the back shell assembly includes a plurality of cable subassemblies and a back shell holder. Each cable subassembly from the plurality of cable subassemblies includes a compression connector portion and a cable portion, where the cable portion is mechanically coupled and electrically coupled to the compression connector portion. A contact wire and a contact spring of each cable subassembly is compressed against a respective plated contact pad on the top surface of the electronic package, where the compressed contact wire and the compressed contact spring of each cable subassembly is electrical coupled to the electronic package via the respective plated contact pad.

16 Claims, 8 Drawing Sheets

(51) Int. Cl.
*H01R 12/70* (2011.01)
*H01R 43/20* (2006.01)
*H01R 12/77* (2011.01)
*H01R 13/17* (2006.01)
*H01R 13/66* (2006.01)
*H01R 107/00* (2006.01)

(56) References Cited

U.S. PATENT DOCUMENTS

| | | | | |
|---|---|---|---|---|
| 5,386,344 A | | 1/1995 | Beaman | |
| 5,460,537 A | * | 10/1995 | Noschese | H01R 12/7005 439/325 |
| 5,816,863 A | * | 10/1998 | Reichle | H04Q 1/142 439/717 |
| 6,134,120 A | * | 10/2000 | Baldwin | H05K 7/142 174/255 |
| 6,234,820 B1 | * | 5/2001 | Perino | H01R 12/7005 439/326 |
| 6,833,618 B2 | * | 12/2004 | Ono | H01L 25/065 257/726 |
| 7,086,866 B1 | * | 8/2006 | Folan | H01R 12/716 439/108 |
| 7,156,678 B2 | * | 1/2007 | Feldman | H01R 4/024 439/326 |
| 7,959,453 B2 | * | 6/2011 | Guering | H02B 1/38 439/165 |
| 8,450,201 B2 | | 5/2013 | Braunisch | |
| 8,608,504 B2 | * | 12/2013 | Tseng | H01R 13/6471 439/497 |
| 8,770,990 B2 | | 7/2014 | Sytsma | |
| 9,011,177 B2 | | 4/2015 | Lloyd | |
| 9,915,797 B2 | | 3/2018 | Zbinden | |
| 2002/0068484 A1 | * | 6/2002 | Gutierrez | H01R 24/64 439/620.11 |
| 2002/0160663 A1 | * | 10/2002 | Gutierrez | H01R 13/717 439/676 |
| 2004/0161964 A1 | * | 8/2004 | Liebenow | H01R 13/64 439/488 |
| 2005/0220425 A1 | * | 10/2005 | Kropp | G02B 6/4292 385/88 |
| 2007/0004274 A1 | * | 1/2007 | Tabata | H01R 13/514 439/540.1 |
| 2013/0045611 A1 | * | 2/2013 | MacDougall | H01R 12/73 439/55 |
| 2015/0111410 A1 | * | 4/2015 | Gingrich, III | H01R 13/24 439/358 |
| 2018/0034175 A1 | * | 2/2018 | Lloyd | H01R 12/714 |
| 2018/0287280 A1 | | 10/2018 | Ratkovic | |
| 2019/0027870 A1 | | 1/2019 | Lloyd | |
| 2019/0288422 A1 | * | 9/2019 | Champion | H01R 13/2442 |

* cited by examiner

OFF THE MODULE CABLE ASSEMBLY

FIELD OF THE INVENTION

This disclosure relates generally to copper signal cables, and in particular, to cable connectors for coupling to a top surface of an electronic package.

BACKGROUND OF THE INVENTION

Presently, various electronic components utilize Land grid Array (LGA) sockets to provide signal and power connections between a processor package and a printed circuit card. Impedance variations in the LGA socket, along with dielectric losses in the printed circuit card are typically the limiting factors in performance and hinder the ability to support ever-growing signal data rates. Surface-Mount Technology (SMT) allows for a connector to attach to a top surface of the processor package, where a cable is initially plugged into the connector prior to a heatsink and load hardware being actuated. Uniform loading of the processor package is typically of a concern due to a tolerance stack of all the components. Furthermore, serviceability is affected since the load hardware must be de-actuated and the heatsink removed to service cables in the system.

SUMMARY

One aspect of an embodiment of the present invention discloses an apparatus for an Off The Module (OTM) cable assembly comprising a back shell assembly and a guide block, wherein the guide block is disposed on a top surface of an electronic package. The back shell assembly is disposed inside a cavity of the guide block at an angle relative to the top surface of the electronic package, wherein the back shell assembly includes a plurality of cable subassemblies and a back shell holder. Each cable subassembly from the plurality of cable subassemblies includes a compression connector portion and a cable portion, where the cable portion is mechanically coupled and electrically coupled to the compression connector portion. A contact wire and a contact spring of each cable subassembly is compressed against a respective plated contact pad on the top surface of the electronic package, wherein the compressed contact wire and the compressed contact spring of each cable subassembly is electrical coupled to the electronic package via the respective plated contact pad.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Figure 1A:
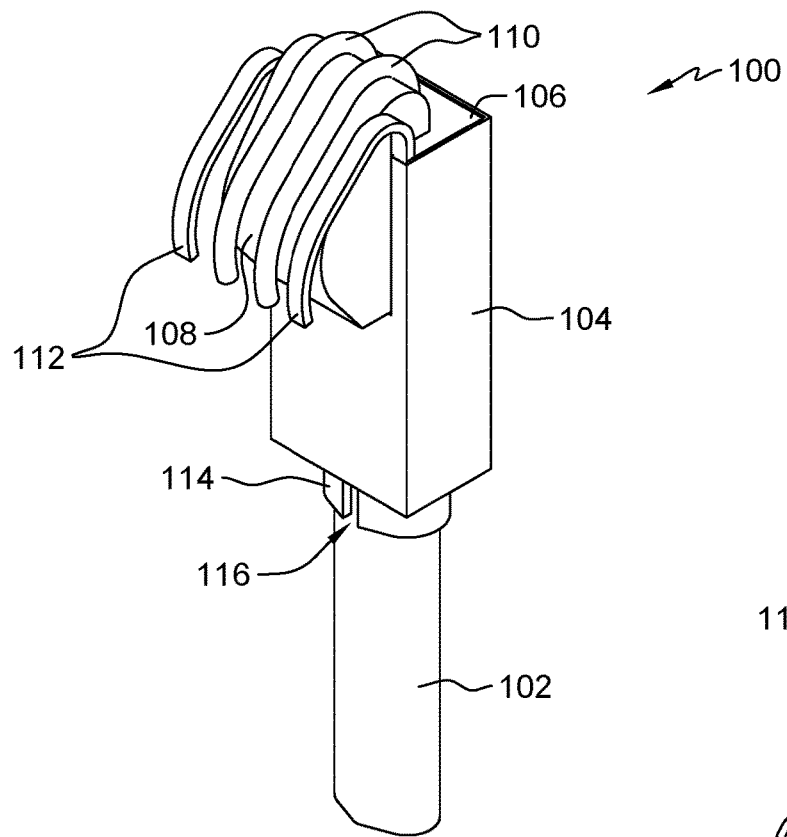
FIG. 1A depicts a front view of a cable assembly, in accordance with an embodiment of the present invention.

Embodiments of the present invention provide a structure mechanically and electrically coupling multiple cables to a processor module. An Off-The-Module (OTM) cable utilizes a land grid array (LGA) style contact interface, where plated contact pads (e.g., gold) on a top surface of a processor package would allow for the electrical coupling between the processor and the OTM cable. The plated contact pads on the processor module utilize similar plate metallurgy to the LGA style contact interface found on a bottom surface of the processor package. The OTM cable couples to the top surface of the processor package at an angle (e.g., 45°) to allow for plugging and unplugging of the cable without removing the heat sink and LGA socket load hardware. A guide module coupled (i.e., bonded) to the top surface of the processor package provides alignment, loading, and retention of the OTM cable assembly to the processor package. Protruding edges on either side of a back shell of the connector portion of the OTM cable align with slots in the guide module to direct the connector portion of the OTM cable into the guide module. The LGA style contact interface on the OTM cable is actuated by manually pressing on the back shell until the spring latch is engaged with the guide module. The OTM cable is disengaged by pressing on the spring latch. The OTM cable and guide module eliminate a need for a paddle card, therefore improving on data signal rates and performance.

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure or first member, is present on a second element, such as a second structure or second member, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

FIG. 1A depicts a front view of a cable assembly, in accordance with an embodiment of the present invention. Cable assembly 100, also referred to as cable subassembly, includes cable 102 with metal shell 104 covering insulator 106, where contact wires 110 are disposed in insulator 106 and electrically coupled to cable 102. Details regarding interior components of cable 102 are discussed in further detail with regards to FIG. 1D. Insulator 106 provides a structure for supporting contact wires 110, where contact wires 110 extend from a lower surface of insulator 106 towards cable 102 and extend from an upper surface of insulator 106 along the y-axis. Insulator 106 is an electrical insulator constructed of a material that does not allow for internal electric charges to flow freely from contact wires 110. Insulator 106 includes support structure 108 upon which contact wires 110 are disposed, where contact wires 110 curve around support structure 108 as contact wires 110 extend from the upper surface of insulator 106. In this embodiment, support structure 108 has an acute radius bend (i.e., x<90°), where contact wires 110 curve around the acute radius bend to form an angle in the 90°<x<180° range when following contact wires 110 extending from the upper surface of insulator 106 in the positive y-axis direction.

Contact springs 112 are coupled to insulator 106 and ground strap 114, such that a single contact spring 112 is positioned on either end of support structure 108. The metal shell 104 surrounds the insulator 106 and the ground strap 114 to provide electromagnetic shielding in order to minimize coupled noise between the adjacent cable subassemblies. Each of contact springs 112 has an acute radius bend (i.e., x<90°), similar to the acute radius bend found on support structure 108 with disposed contact wires 110. In this embodiment, the acute radius bend for each of contact springs 112 (e.g., 40°) is greater than the acute radius bend of support structure 108 (e.g., 30°), where compressing each of contact springs 112 reduces the acute radius bend (e.g., 40°>x>30°). When cable assembly 100 is inserted into guide block 310, each of contact springs 112 compress when contacting a respective contact pad 308. Details regarding the insertion of cable assembly 100 into guide block 310 is discussed in further details with regards to FIGS. 5A and 5B. Ground strap 114 is electrically coupled to contact springs 112 and includes drain wire termination slot 116 for drain wire 122, discussed in further detail with regards to FIG. 1D. In this embodiment, ground strap 114 is secured to cable 102 by an interference fit between the drain wire 122 in the cable 102 and the wire termination slot 116 in the ground strap 114.

Figure 1B:
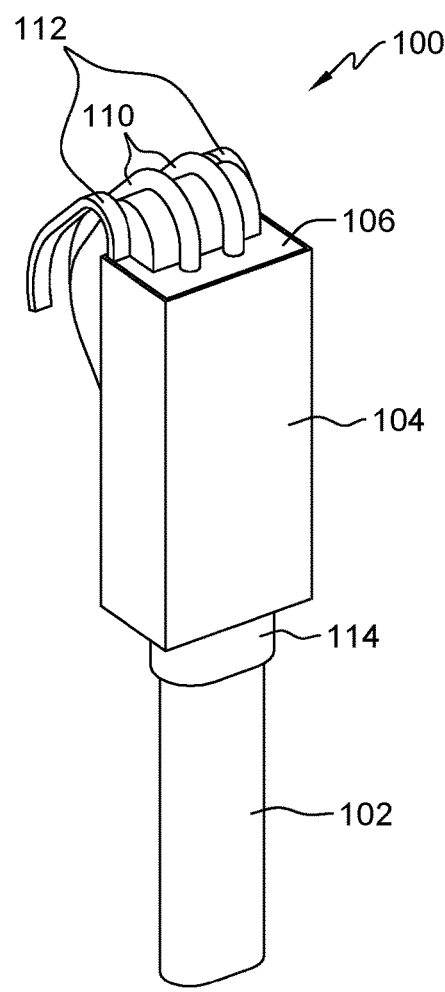
FIG. 1B depicts a back view of the cable assembly from FIG. 1A, in accordance with an embodiment of the present invention.

FIG. 1B depicts a back view of the cable assembly from FIG. 1A, in accordance with an embodiment of the present invention. The back view of cable assembly 100 illustrates metal shell 104 covering electrically coupled cables 102 to contact wires 110, where contact wires 110 extend from the upper surface of insulator 106. Metal shell 104 can be secured to the ground strap 114 utilizing mechanical means (springs, welds) on either side of metal shell 104. In this, embodiment, contact springs 112 are an integral part of the ground strap 114.

Figure 1C:
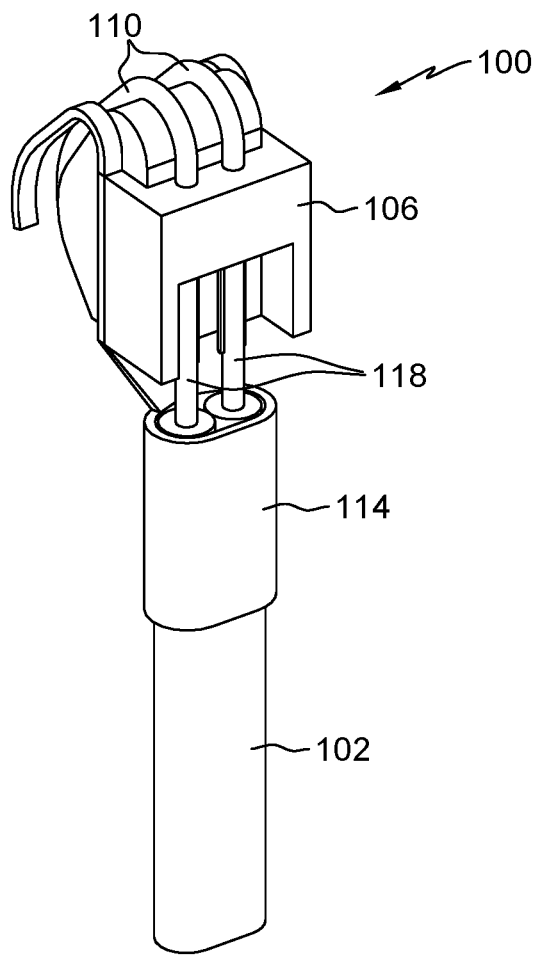
FIG. 1C depicts the cable assembly from FIG. 1A with a removed metal shell, in accordance with an embodiment of the present invention.

FIG. 1C depicts the cable assembly from FIG. 1A with a removed metal shell 104, in accordance with an embodiment of the present invention. The back view of cable assembly 100 with metal shell 104 removed illustrates cables 102 with wires 118 electrically coupled to contact wires 110, where contact wires 110 extend through insulator 106. Cable 102 includes two cylindrical shaped wires 118, where each of wires 118 is disposed in a U-shaped portion of each of the two contact wires 110 and provides the electrical coupling between contact wires 110 and wires 118. In this embodiment, the U-shaped portion of contact wire 110 surrounds 180° of cylindrical shaped wire 118. In other embodiments, different geometries are used to couple the contact wires 110 to the wires 118 such as a hollow cylindrical portion or a simple flat portion on the contact wires 110. As previously discussed, ground strap 114 provides the structural connection for mechanically coupling the compression connector portion of cable assembly 100 to cable 102 and also provides the means for electrically coupling the drain wire 122 to the contact springs 114 and the metal shell 104. In another embodiment, solder is utilized to electrically couple each contact wire 110 to each respective wire 118. In yet another embodiment, cable assembly 100 is constructed as such that wire 118 extends from cable 102 through insulator 106, where contact wires 110 are the same as wires 118.

Figure 1D:
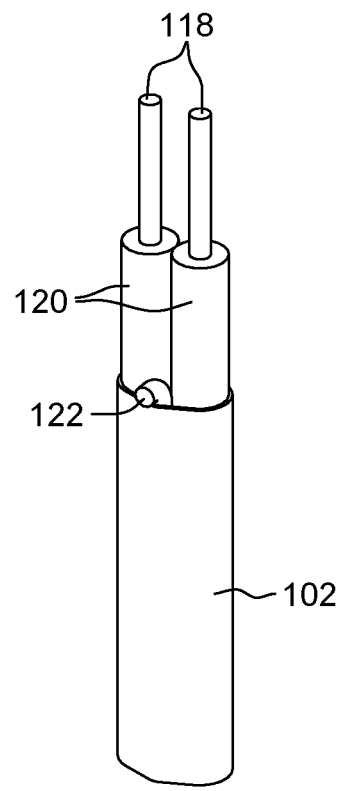
FIG. 1D depicts a cable portion of the cable assembly from FIG. 1A with a removed compression connector, in accordance with an embodiment of the present invention.

FIG. 1D depicts a cable portion of the cable assembly from FIG. 1A with a removed compression connector, in accordance with an embodiment of the present invention. Cable 102 includes two wires 118 each surrounded by insulation 120 extending a length of cable 102, where an exterior foil shield of cable 102 secures wires 118 and insulation 120 together. Drain wire 122 extends through the length of cable 102 and protrudes beyond an exterior planar surface of cable 102, such that drain wire 122 contacts and electrically couples to drain wire termination slot 116 on ground strap 114. In this embodiment, drain wire 122 protrudes out of the exterior planar surface of cable 102 at a 90° angle.

Figure 1E:
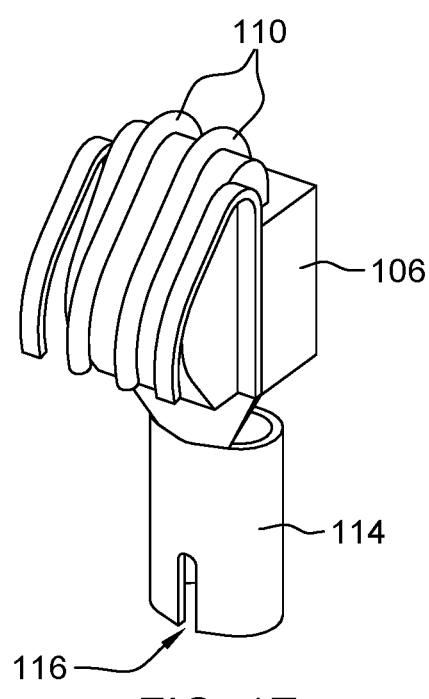
FIG. 1E depicts a compression connector of the cable assembly from FIG. 1A, in accordance with an embodiment of the present invention.

FIG. 1E depicts a compression connector of the cable assembly from FIG. 1A, in accordance with an embodiment of the present invention. In this embodiment, the compression connector portion with contact wires 110 disposed in insulator 106 is de-coupled from cable assembly 100. Ground strap 114 includes an outer surface and an inner surface, where cable 102 slides inside the inner surface and ground strap 114. In this embodiment, an inner area surrounded by the inner surface of ground strap 114 that accepts cable 102 is oval shaped, where a cross-section of cable 102 is oval shaped as well. The inner area surrounded by the inner surface of ground strap 114 is greater than an area of the cross-section of cable 102 to allow for cable 102 to slide inside the inner area and inner surface of ground strap 114. A width of drain wire termination slot 116 is smaller than a width (i.e., diameter) of drain wire 122 to provide an inference mechanical and electrical connection.

Figure 2A:
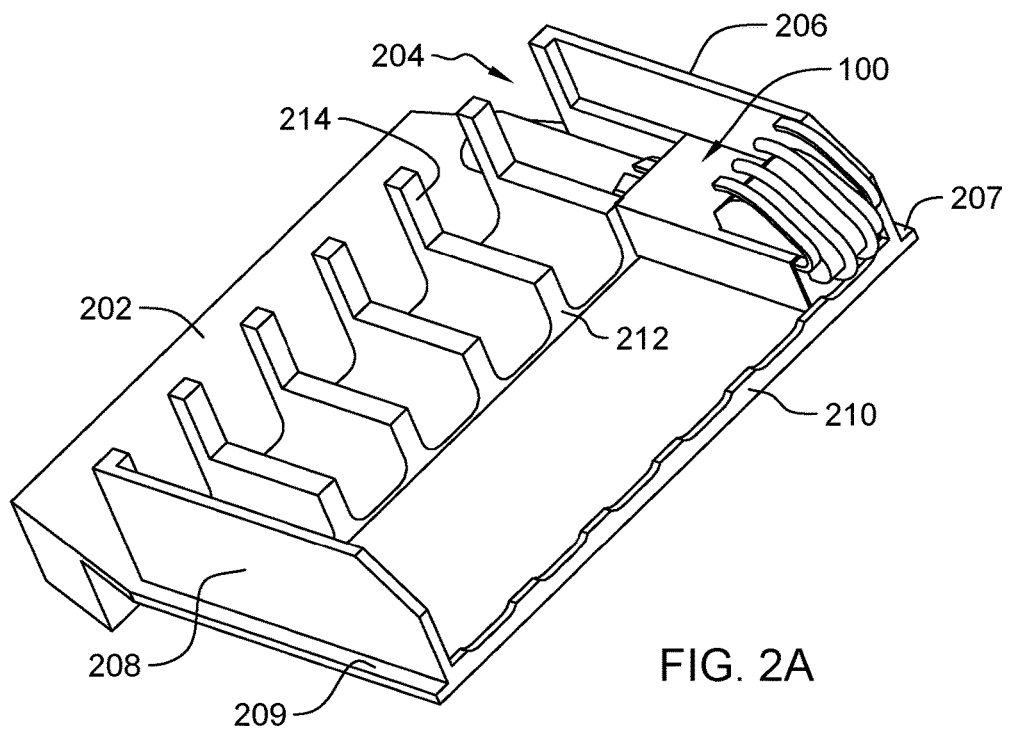
FIG. 2A depicts a back shell holder with a single cable assembly, in accordance with an embodiment of the present invention.

FIG. 2A depicts a back shell holder with a single cable assembly, in accordance with an embodiment of the present invention. Back shell holder 202 provides multiple cavities 204, where a single cable assembly 100 is disposed in a single cavity 204. For discussion and illustrative purposes, cable assembly 100 only includes a compression connector portion and a cable portion. Right sidewall 206 and left sidewall 208 provide the bounds in which cable assemblies are disposed in back shell holder 202. In this embodiment, cable assembly 100 is disposed on a front surface of back shell holder 204 between right sidewall 206, edge 210, and lower interior wall 212. A distance between edge 210 and lower interior wall 212 is such that the compression connector portion of cable assembly 100 is placeable between edge 210 and lower interior wall 212, with the cable portion of cable assembly 100 extending through cavity 204. A top surface of the compression connector portion of cable assembly 100 faces edge 210, a side portion of the compression connector portion of cable assembly 100 faces right sidewall 206, and lower surface of the compression connector portion of cable assembly 100 faces lower interior wall 212.

Lower interior wall 212 includes a U-shaped cutout to cradle cable assembly 100 when disposed on the front surface of back shell holder 202. In this embodiment, the dimensions of the U-shaped cutout of lower interior wall 212 is such that ground strap 114 is placeable within the U-shaped cutout, where the U-shaped cutout of lower interior wall 212 prevents the lateral movement of cable assembly 100. Furthermore, the U-shaped cutout of lower interior wall 212 can include one or more tables for securing cable assembly 100, such that the one or more tabs prevent vertical movement of cable assembly 100 once the one or more tables included in the U-shaped cutout of lower interior wall 212 are engaged. Upper interior wall 214 comprises multiple cavities and members, where each of the multiple members share a planar surface. In this embodiment, there are six cavities 204 between seven members of upper interior wall 214. A width of cavity 204 is such that the cable portion of cable assembly 100 is placeable in the cavity between two members of upper interior wall 214. Right guide edge 207 protruding from right sidewall 206 and left guide edge 209 protruding from left sidewall 208 for guiding back shell holder 202 into guide block 310 is discussed in further details with regards to FIGS. 5A and 5B.

Figure 2B:
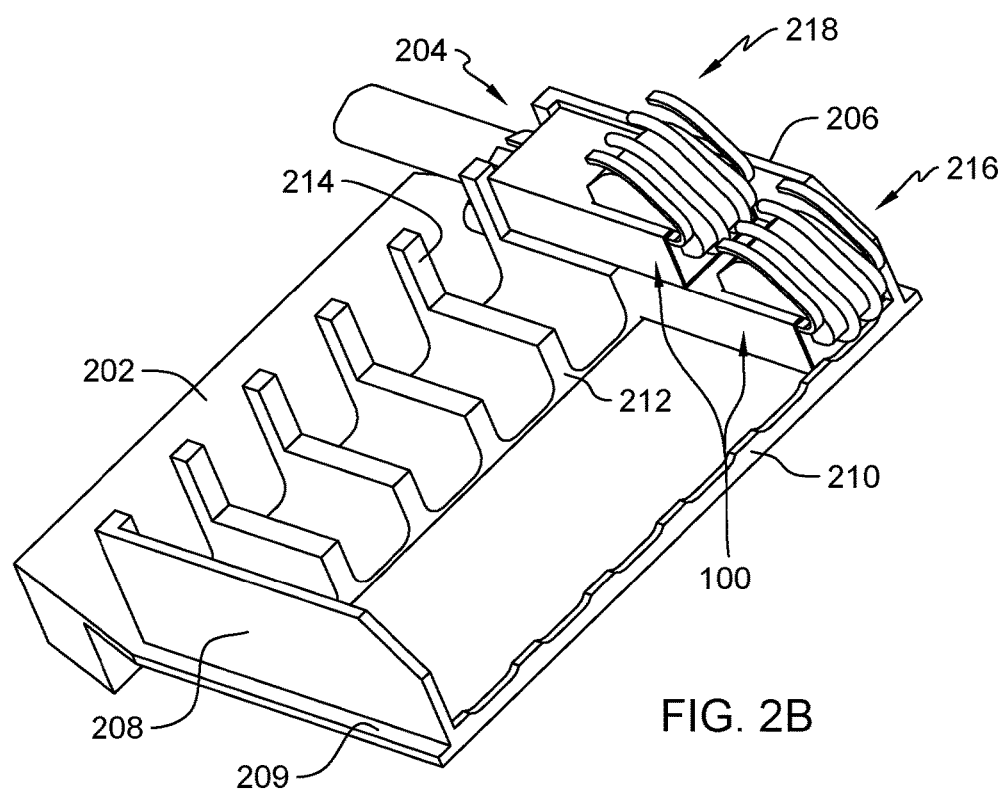
FIG. 2B depicts the back shell holder from FIG. 2A with a single stack of cable assemblies, in accordance with an embodiment of the present invention.

FIG. 2B depicts the back shell holder from FIG. 2A with a single stack of cable assemblies, in accordance with an embodiment of the present invention. In this embodiment, back shell holder 202 provides multiple cavities 204, where two cable assemblies 100 are arranged in a stacked manner and disposed in a single cavity 204. For discussion and illustrative purposes, each cable assembly 100 only includes a compression connector portion and a cable portion. In this embodiment, a first (i.e., lower) cable assembly 100 is disposed on a front surface of back shell holder 204 between right sidewall 206, edge 210, and lower interior wall 212 and a second (i.e., upper) cable assembly 100 is disposed on a front surface of the first cable assembly 100 between right sidewall 206 and upper interior wall 214. As previously discussed, a top surface of the compression connector portion of the first cable assembly 100 faces edge 210, a side portion of the compression connector portion of the first cable assembly 100 faces right sidewall 206, and lower surface of the compression connector portion of the first cable assembly 100 faces lower interior wall 212. A top surface of the compression connector portion of the second cable assembly 100 faces edge 210, a side portion of the compression connector portion of the second cable assembly 100 faces right sidewall 206, and lower surface of the compression connector portion of the second cable assembly 100 faces upper interior wall 214.

A distance protruding elements (i.e., contact wires 110 and contact springs 112) of the compression connector portion of the first cable assembly 100 and upper interior wall 212 is such that the compression connector portion of the second cable assembly 100 is placeable between the protruding elements of the compression connector portion of the first cable assembly 100 and upper interior wall 214, with the cable portion of the second cable assembly 100 extending through cavity 204. In another embodiment, right sidewall 206 can include a cutout and/or cavity matching a shape of the side portion of the compression connector portion of the second cable assembly 100 that faces right sidewall 206, where the compression connector portion of the second cable assembly 100 can slide and/or clip into the cutout and/or cavity in the right sidewall 206.

Figure 2C:
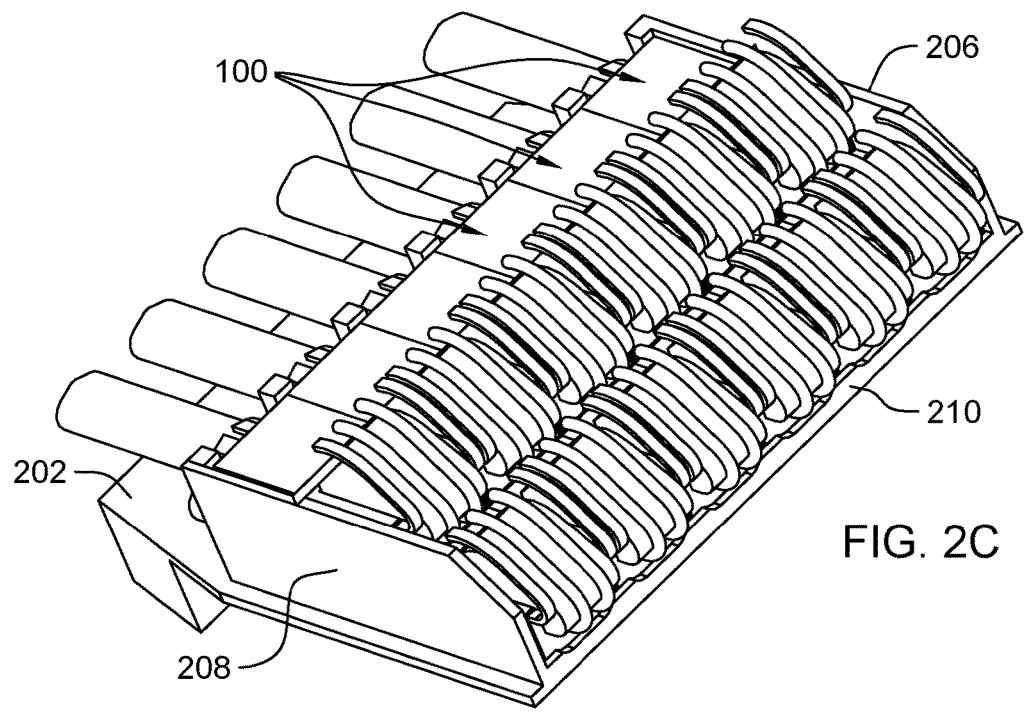
FIG. 2C depicts the back shell holder from FIG. 2A with multiple stacks of cable assemblies, in accordance with an embodiment of the present invention.

FIG. 2C depicts the back shell holder from FIG. 2A with multiple stacks of cable assemblies, in accordance with an embodiment of the present invention. In this embodiment, back shell holder 202 includes a total of 12 cable assemblies arranged in two stacked rows in a 6×2 configuration. Other configurations are application specific and can include 2×2, 4×2, 8×2, or any other number of cable assemblies that does not compromise the structural integrity of back shell holder 202. Similar to FIG. 2B, a first set of stacked cable assemblies 100 includes a first (i.e., lower) cable assembly 100 disposed on a front surface of back shell holder 204 between right sidewall 206, edge 210, and lower interior wall 212 and a second (i.e., upper) cable assembly 100 disposed on a front surface of the first cable assembly 100 between right sidewall 206 and upper interior wall 214. This embodiment, includes a total of six sets of stacked cable assemblies comprising the 6×2 configuration, where the first set of stacked cable assemblies 100 is positioned at right side wall 206 and a sixth set of stacked cable assemblies 100 is positioned at left side wall 208.

On a right side of back shell holder 202 for the first set of stacked cable assemblies, a top surface of the compression connector portion of a first cable assembly 100 faces edge 210, a first side portion of the compression connector portion of the first cable assembly 100 faces right sidewall 206, a second side portion of the compression connector portion of the first cable assembly faces another compression connector portion of a second set of cable assemblies, and lower surface of the compression connector portion of the first cable assembly 100 faces lower interior wall 212. A top surface of the compression connector portion of a second cable assembly 100 faces edge 210, a side portion of the compression connector portion of the second cable assembly 100 faces right sidewall 206, a second side portion of the compression connector portion of the first cable assembly faces another compression connector portion of a second set of cable assemblies, and lower surface of the compression connector portion of the second cable assembly 100 faces upper interior wall 214.

On a left side of back shell holder 202 for the sixth set of stacked cable assemblies, a top surface of the compression connector portion of a first cable assembly 100 faces edge 210, a first side portion of the compression connector portion of the first cable assembly 100 faces left sidewall 208, a second side portion of the compression connector portion of the first cable assembly faces another compression connector portion of a fifth set of cable assemblies, and lower surface of the compression connector portion of the first cable assembly 100 faces lower interior wall 212. A top surface of the compression connector portion of a second cable assembly 100 faces edge 210, a side portion of the compression connector portion of the second cable assembly 100 faces left sidewall 208, a second side portion of the compression connector portion of the first cable assembly faces another compression connector portion of a second set of cable assemblies, and lower surface of the compression connector portion of the second cable assembly 100 faces upper interior wall 214.

Figure 2D:
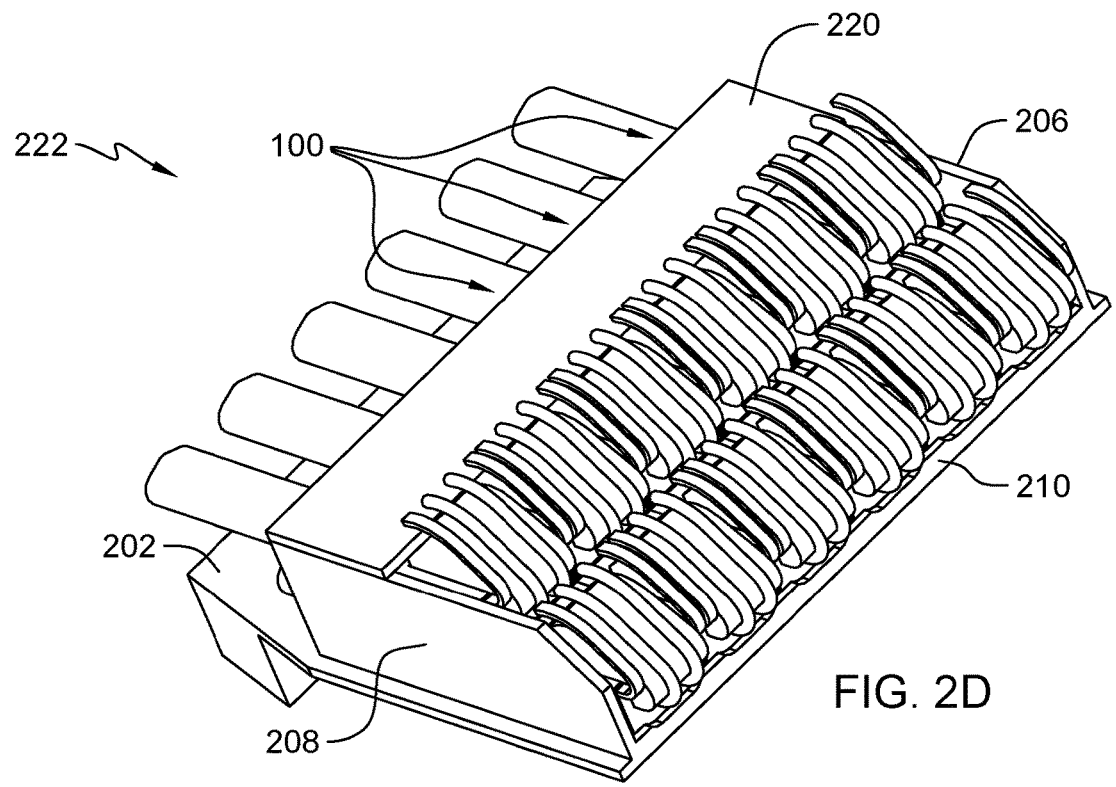
FIG. 2D depicts the back shell holder from FIG. 2A with multiple stacks of cable assemblies and top cover, in accordance with an embodiment of the present invention.

FIG. 2D depicts the back shell holder from FIG. 2A with multiple stacks of cable assemblies and top cover, in accordance with an embodiment of the present invention. In this embodiment, back shell assembly 222 includes top cover 220 disposed on a top row of cable assemblies 100 that are present in the 6×2 configuration. Top cover 220 is coupled to back shell holder 202, such that cable assemblies 100 are secured between back shell holder 202, edge 210, right side wall 206, left sidewall 208, lower interior wall 212 (not visible in FIG. 2D), upper interior wall 214 (not visible in FIG. 2D), and top cover 220. A lower surface of top cover 220 couples to a top surface of right sidewall 206, a top surface of left sidewall 208, and a top surface of upper interior wall 214, where a first end of the lower surface of top cover 220 couples to the top surface of right sidewall 206, a second end of the lower surface of top cover 220 couple to the top surface of left sidewall 208, and a first side of the lower surface of top cover 220 coupled to the top surface of upper interior wall 214.

Figure 3:
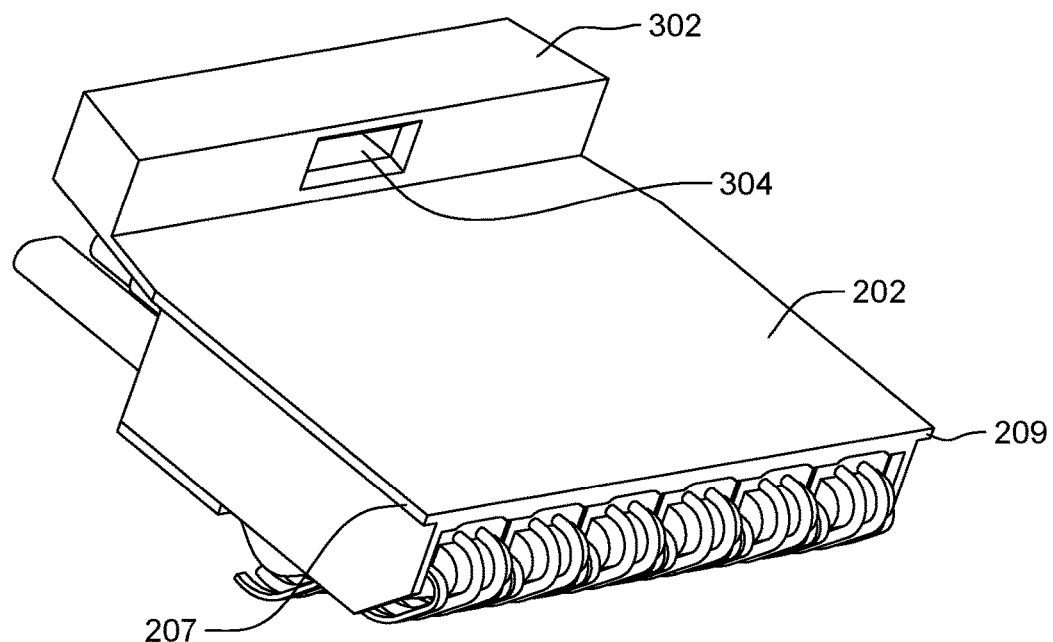
FIG. 3 depicts the back shell holder with the multiple stacks of cable assemblies at an angle of insertion, in accordance with an embodiment of the present invention.

FIG. 3 depicts the back shell holder with the multiple stacks of cable assemblies at an angle of insertion, in accordance with an embodiment of the present invention. In this embodiment, back shell holder 202 is positioned at an angle of insertion into guide block 310 via right guide edge 207 and left guide edge 209, discussed in further detail with regards to FIGS. 4 and 5A. Back shell holder 202 includes handle 302 with aperture 304, where cavity 304 allows for the engagement of notch 318 of spring latch 316, discussed in further detail with regards to FIGS. 4 and 5A.

Figure 4:
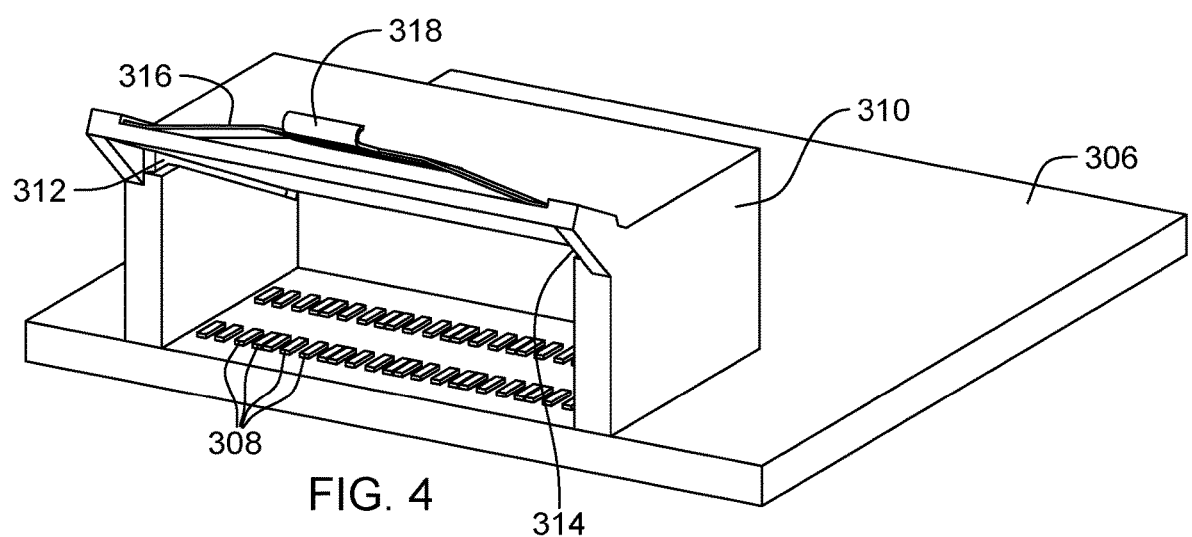
FIG. 4 depicts a guide block for accepting the back shell holder with the multiple stacks of cable assemblies at the angle of insertion, in accordance with an embodiment of the present invention.

FIG. 4 depicts a guide block for accepting the back shell holder with the multiple stacks of cable assemblies at the angle of insertion, in accordance with an embodiment of the present invention. A top surface of processor module 306 includes plated contact pads 308 and guide block 310, where plated contact pads 308 are positioned within a cavity of guide block 310. Plated contact pads 308 are positioned with the cavity of guide block 310 such that each plated contact pad 308 aligns with either contact wire 110 or contact spring 112 of cable assembly 100. The two rows of plated contact pads 308 align with two rows of cable assemblies 100 positioned in back shell assembly 222. In this embodiment, each cable assembly 100 include two dedicated plated contact pads 308 for contact wires 110 and two dedicated plated contact pads 308 for contact springs 212, where a total number of plated contact pads 308 is equal to 48=(4×[6×2]).

Left guide edge 209 of back shell holder 202 slides inside left guide slot 312 of guide block 310 and right guide edge 207 of back shell holder 202 slides inside right guide slot 314 of guide block 310. A combination of right guide edge 207 and right guide slot 314, along with left guide edge 209 and left guide slot 312 allows for a controlled insertion and extraction of back shell assembly 222 from guide block 310. Dimensions of either left guide slot 312 or right guide slot 314 are greater than dimension of either right guide edge 207 or left guide edge 209. An angle between each of left guide slot 312 or right guide slot 314 and the top surface of processor module 306 represents the angle of insertion of back shell assembly 222 with cable assemblies 100. Spring latch 316 with notch 318 is positioned on a protruding member of guide block, where notch 318 aligns with aperture 304 of handle 302 once back shell assembly 222 is insert into guide block 310.

Figure 5A:
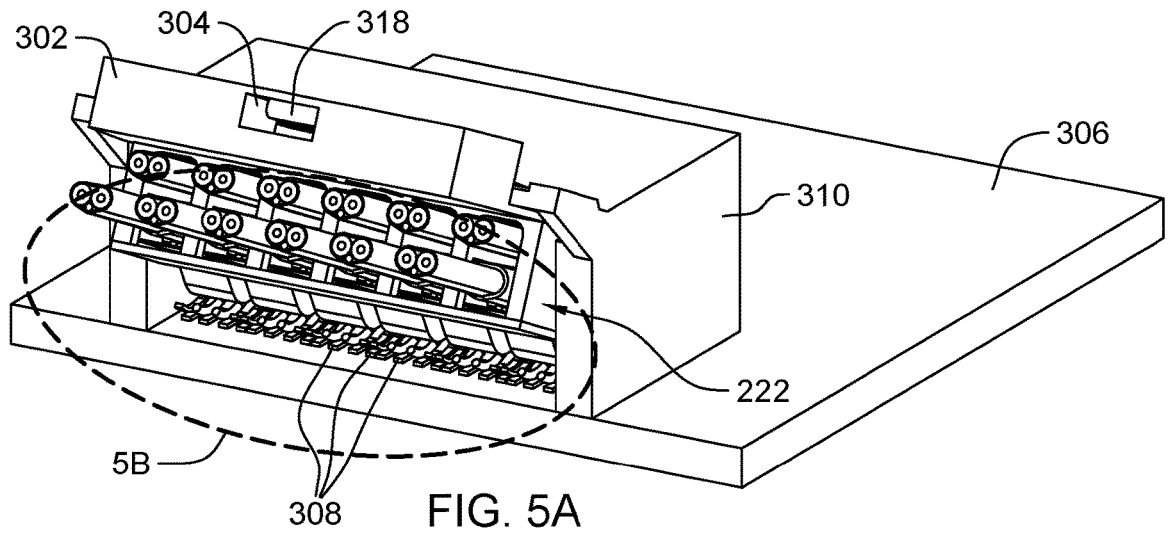
FIG. 5A depicts a front view of a guide block with an inserted back shell assembly with the multiple stacks of cable assemblies, in accordance with an embodiment of the present invention.

FIG. 5A depicts a front view of a guide block with an inserted back shell assembly with the multiple stacks of cable assemblies, in accordance with an embodiment of the present invention. Guide block 310 on processor module 306 includes back shell assembly 222, where back shell assembly 222 is disposed inside the cavity of guide block 310. An enhanced view of plated contact pads 308 and respective contact wires 110 and contact springs 112 are discussed in further details with regards to FIG. 5B. As back shell assembly 222 slides into guide block 110, notch 318 of spring latch 316 slides inside aperture 304 of handle 302. Notch 318 allows for back shell assembly 222 to slide into guide block 310 and lock into position. Notch 318 disposed in aperture 304 prevents back shell assembly 222 from sliding out of guide block 310. An external force applied to spring latch 316 releases notch 318 from aperture 304 and allows for back shell assembly 222 to slide out of guide block 310. As previously discussed, the combination of right guide edge 207 and right guide slot 314, along with left guide edge 209 and left guide slot 312 allows for a controlled insertion and extraction of back shell assembly 222 from guide block 310.

Figure 5B:
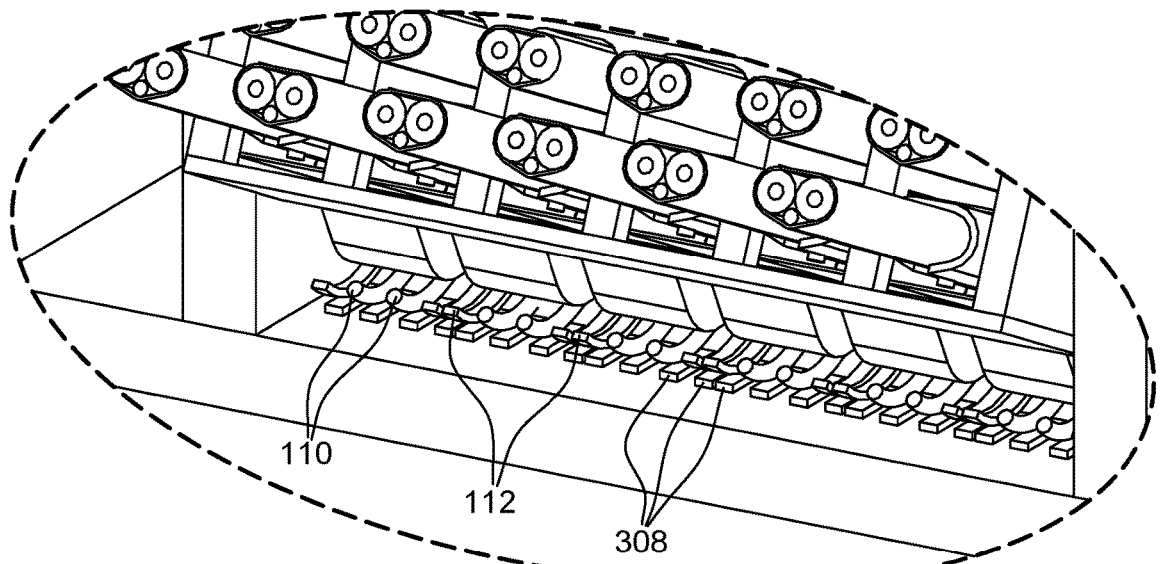
FIG. 5B depicts an enhanced view of the guide block with the inserted back shell assembly with the multiple stacks of cable assemblies, in accordance with an embodiment of the present invention.

FIG. 5B depicts an enhanced view of the guide block with the inserted back shell assembly with the multiple stacks of cable assemblies, in accordance with an embodiment of the present invention. The enhanced view of plated contact pads 308 disposed on processor module 306 illustrates each plated contact pad 308 and respective contact wire 110 or contact spring 112 combination. In this embodiment, each plated contact pad 308 is rectangular in shape and includes a planar top surface for allowing either contact wires 110 or contact spring 112 to electrical couple to plated contact pad 308. Dimensions of each plated contact pad 308 is dependent on a dimensions of either contact wired 110 or contact spring 112. Plated contact pads 308 are positioned such that once back shell assembly 222 is inserted into guide block 310, a contact patch of either contact wire 110 or contact spring 112 is centered on the top surface of plated contact pad 308. An angle of insertion of back shell assembly 222 into guide block 310 is such that the contact wires 110 and contact springs 112 are compressed resulting in a wiping action and normal force (i.e. z-axis direction) against the top surface of the plated contact pads 308 to ensure a reliable electrical connection between the contact wires 110, contact springs 112, and the contact pads 308.

Figure 5C:
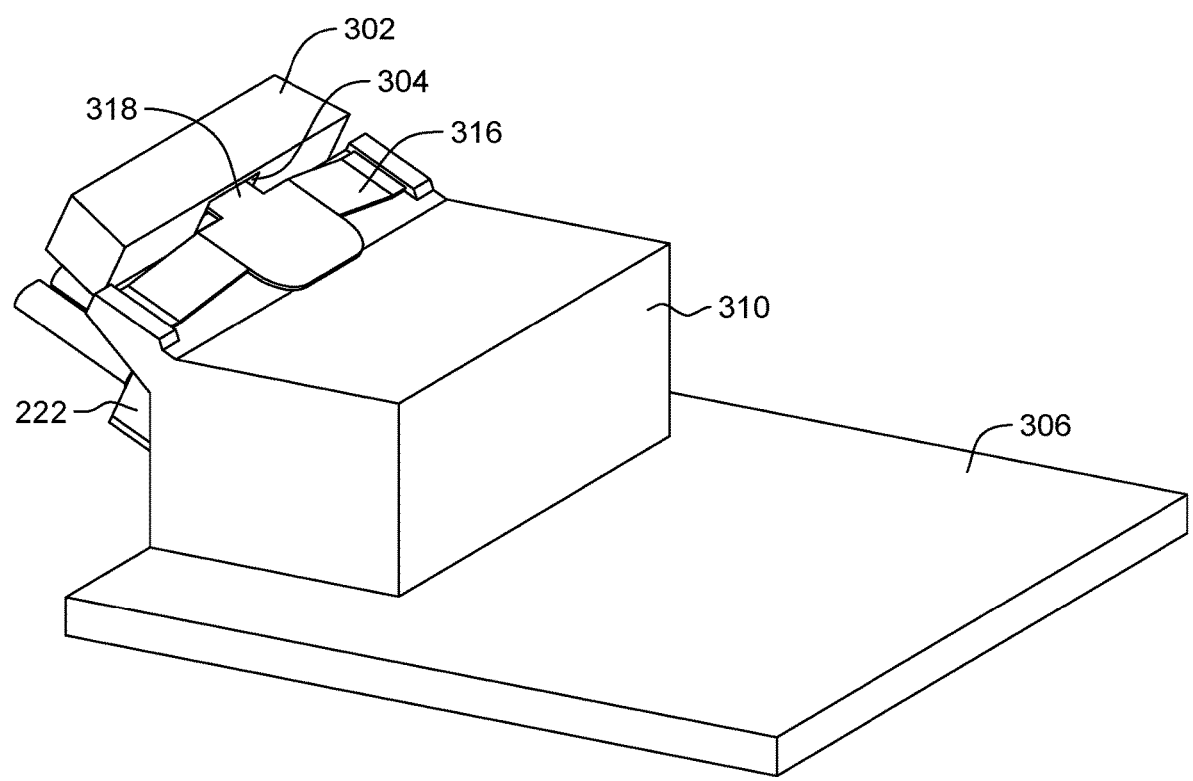
FIG. 5C depicts a back view of a guide block with an inserted back shell assembly with the multiple stacks of cable assemblies, in accordance with an embodiment of the present invention.

FIG. 5C depicts a back view of a guide block with an inserted back shell assembly with the multiple stacks of cable assemblies, in accordance with an embodiment of the present invention. Guide block 310 coupled to processor module 306 includes back shell assembly 222, where spring latch 316 is engaged and back shell assembly is secured to guide block 310. Notch 318 of spring latch 316 is positioned within aperture 304 of handle 302 of back shell assembly 222. To release notch 318 to allow for the extraction of back shell assembly 222 from guide block 310, a lateral force (i.e., −y axis direction) is applied to a top planar surface of spring latch 316 and the lateral force is translated to notch 318. Notch 318 is pushed in a downward motion and released from aperture 304 of handle 302, resulting in back shell assembly 222 being released from guide block 310. It is to be noted that spring latch 316 represents only one embodiment of a possible locking mechanism for securing back shell assembly 222 to guide block 310.

The terminology used herein is for the purpose of describing particular embodiments only and is not intended to be limiting to the invention. As used herein, the singular forms "a", "an" and "the" are intended to include the plural forms as well, unless the context clearly indicates otherwise.

Having described preferred embodiments of a cooled containment compartment for package battery cells (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. An apparatus for an Off The Module (OTM) cable assembly, the apparatus comprising:
 a back shell assembly and a guide block, wherein the guide block is disposed on a top surface of an electronic package;
 the back shell assembly is disposed inside a cavity of the guide block at an angle relative to the top surface of the electronic package, wherein the back shell assembly includes a plurality of cable subassemblies and a back shell holder, wherein a first guide edge of the back shell holder aligns with a first guide slot of the guide block for insertion and extraction of the back shell assembly from the guide block;
 a protruding member of the guide block, wherein the protruding member includes a spring latch with a notch;
 the back shell assembly includes a handle with an aperture, wherein the aperture aligns with the notch of the spring latch;
 each cable subassembly from the plurality of cable subassemblies includes a compression connector portion and a cable portion, where the cable portion is mechanically coupled and electrically coupled to the compression connector portion; and
 a contact wire and a contact spring of each cable subassembly is compressed against a respective plated contact pad on the top surface of the electronic package, wherein the contact wire and the contact spring of each cable subassembly is electrical coupled to the electronic package via the respective plated contact pad.

2. The apparatus of claim 1, wherein the notch is disposed inside aperture of the handle securing the back shell assembly to the guide block.

3. The apparatus of claim 1, wherein a second guide edge of the back shell holder aligns with a second guide slot of the guide block for insertion and extraction of the back shell assembly from the guide block, wherein the first guide edge is located opposite the second guide.

4. The apparatus of claim 1, further comprising:
 a first row of the plurality of cable subassemblies and a second row of the plurality of cable subassemblies, wherein the second row of the plurality of cable subassemblies is partially stacked on the first row of the plurality of cable subassemblies.

5. The apparatus of claim 4, wherein the first row of the plurality of cable subassemblies is disposed inside the back shell holder surrounded by an edge, a lower interior wall, a first sidewall, and a second sidewall.

6. The apparatus of claim 5, wherein the second row of the plurality of cable subassemblies is surrounded by an upper interior wall, a first sidewall, a second sidewall, and a top cover, wherein the top cover secures the first row and second row of the plurality of cable subassemblies in the back shell holder.

7. The apparatus of claim 1, wherein each cable subassembly includes a cable portion and a compression connector portion, wherein the compression connector portion includes the contact wire and the contact spring.

8. The apparatus of claim 1, wherein the respective contact pads are disposed in the cavity of the guide block.

9. The apparatus of claim 7, further comprising:
 a wire portion of the cable portion electrically coupled to the contact wire of the compression connector portion; and
 a drain wire of the cable portion electrically coupled to the contact spring of the compression connector portion.

10. The apparatus of claim 9, wherein the compression connector portion includes an insulator, a support structure, and a ground strap.

11. The apparatus of claim 10, wherein the contact wire is disposed in the insulator and disposed on the support structure.

12. The apparatus of claim 11, wherein a metal shell covers the insulator and the contact wire disposed in the insulator.

13. The apparatus of claim 12, wherein the contact wire extends from a lower surface of the insulator towards the cable portion and extends from an upper surface of the insulator.

14. The apparatus of claim 13, wherein the contact wire extending from the upper surface of the insulator curves around and is disposed on the support structure.

15. The apparatus of claim 12, wherein the ground strap mechanically couples the compression connector portion to the cable portion and electrically couples the drain wire to the contact spring of each cable subassembly and the metal shell.

16. The apparatus of claim 15, further comprising:
 a drain wire termination slot on the ground strap, wherein the drain wire is disposed in the drain wire termination slot, wherein the drain wire termination slot provides an inference fit for a mechanical and electrical connection.

* * * * *